United States Patent [19]
Lewison

[11] Patent Number: 5,933,453
[45] Date of Patent: Aug. 3, 1999

[54] DELTA-SIGMA PULSE WIDTH MODULATOR CONTROL CIRCUIT

[75] Inventor: Richard S. Lewison, Corvallis, Oreg.

[73] Assignee: Hewlett-Packard Company, Palo Alto, Calif.

[21] Appl. No.: 08/846,610

[22] Filed: Apr. 29, 1997

[51] Int. Cl.⁶ .................................................. H03K 7/08
[52] U.S. Cl. .......................... 375/238; 375/247; 370/212; 332/109
[58] Field of Search .................... 375/238, 247; 370/212; 332/109

[56] References Cited

U.S. PATENT DOCUMENTS

| | | | |
|---|---|---|---|
| 4,685,114 | 8/1987 | Welling | 375/238 |
| 5,055,708 | 10/1991 | Sugawara | 327/110 |
| 5,055,802 | 10/1991 | Hietala et al. | 331/16 |
| 5,150,324 | 9/1992 | Takasuka et al. | 364/807 |
| 5,245,345 | 9/1993 | Kohdaka et al. | 341/152 |
| 5,534,827 | 7/1996 | Yamaji | 332/103 |
| 5,539,403 | 7/1996 | Tani et al. | 341/144 |
| 5,617,058 | 4/1997 | Adrian et al. | 330/10 |
| 5,677,618 | 10/1997 | Fiez et al. | 323/282 |
| 5,768,316 | 6/1998 | Sogo | 375/260 |

FOREIGN PATENT DOCUMENTS

| | | | |
|---|---|---|---|
| 0 525 771 | 7/1992 | European Pat. Off. | H04R 3/08 |
| WO 92/11699 | 7/1992 | WIPO | H03M 1/82 |

OTHER PUBLICATIONS

Lancaster, "The Quest for Magic Sine Waves", Circuit Cellular INK, Issue #59, Jun. 1995, pp. 28–35.

Magrath et al., "Power Digital–to–Analogue Conversion Using a Sigma–Delta Modulator with Controlled Limit Cycles", Electronic Letters, vol. 31, No. 4, Feb. 16, 1995, pp. 251–253.

Cooley et al., "PWM and PCM Techniques for Control of Digitally Programmable Switching Power Supplies", IEEE ISBN No. 0–7803–2570–Feb. 1995, pp. 1114–1117.

Mohan et al., "Power Electronics–Converters, Applications, and Design", John Wiley & Sons, Inc., 1989, pp. 161–197, 203–215, 322–323, 331–333, 391,393.

Candy et al., "Oversampling Delta–Sigma Data Converts", IEEE Press, 1992, pp. 1–25, 153,162.

Primary Examiner—Young T. Tse
Attorney, Agent, or Firm—Raymond A. Jenski

[57] ABSTRACT

A delta sigma pulse width modulator control circuit uses a delta sigma modulator as a first stage to create a sequence of pulses representing an input control signal. A pulse width modulator accumulates the sequence of pulses and defines a pulse width modulated output signal from the accumulated pulses. The pulse width modulated signal is given a randomly generated offset to the time of pulse value transition and an adjacent pulse value matching technique is used to reduce harmonically related noise generation.

21 Claims, 8 Drawing Sheets

DELTA-SIGMA PULSE WIDTH MODULATOR CONTROL CIRCUIT

BACKGROUND OF THE INVENTION

The present invention generally relates to an electronic circuit which controls a signal coupled to a load and more particularly relates to a digital pulse width modulator using a delta sigma modulator as an input stage to control a drive signal to a load.

Industry has long used pulse width modulators (PWM) to supply and control drive to motors, direct-current to alternating-current conversion, and many other power loads. As is well known, the duty cycle of a square wave may be varied or integrated to create a desired magnitude of an output-alternating current signal. Due to the non-zero switching time in power switching devices, the number of digital transitions per unit time typically determines the thermal power dissipation of systems using these devices. PWM circuits have a fixed number of transitions per unit time.

Traditional PWM applications use a triangle or sawtooth reference waveform to compare against an incoming analog signal (which may, among other things, be an adjustment signal or a feedback signal or both). The digital result of this comparison is a PWM output. Generally, the generation of such an analog triangle or sawtooth reference waveform has been accomplished using precision capacitors, resistors, and current sources as a charge/discharge ramp up/down circuit. While this implementation is not a problem for discrete realizations, implementing such components in an integrated circuit results in components which are hard to control and may exhibit non-linear behavior—especially if the integrated circuit technology is optimized for digital operation.

PWM technology is relatively simple, produces a PWM output signal which closely approximates the input signal (within the frequency band of interest), and has a fixed number of digital transitions per unit time. Unfortunately, the fixed frequency nature of traditional PWM technology results in a significant amount of spurious harmonic noise signals which can result in significant electromagnetic interference to other electronic circuits.

Overcoming the problem of harmonic noise has been addressed before, with most methods spreading the harmonic noise by dithering the PWM fundamental frequency or introducing extra transitions in the PWM waveform to tailor the spectrum. This spectrum tailoring, however, does not retain the PWM feature of a fixed number of digital transitions per unit time.

Delta sigma modulation (DSM) has been used extensively in analog-to-digital and digital-to-analog conversion, and is typically sampled at a frequency several times higher than the input signal frequency. (Delta sigma modulation is occasionally referred to as sigma delta modulation. The terms are considered interchangeable herein). DSM has the advantage of allowing the shaping of quantization noise in such a way as to significantly reduce the quantization noise at low frequencies relative to the frequency of the switching clock. The output from a DSM circuit is a stream of digital pulses. An average of these digital output pulses over a finite period can be used to represent the input signal, provided that the period chosen is at least half of the period of the input signal. An additional advantage of DSM technology is that DSM circuits can be built using standard digital CMOS processes for integrated circuits. This is because DSM circuits are usually implemented as switched-capacitor circuits which rely on precise capacitor matching rather than absolute capacitor values. A disadvantage of DSM circuits is that the clock frequency employed is at least 100 times the frequency of the input signal. The high frequency DSM clock results in many more transitions per second, than PWM. Operating a DSM at lower clock frequencies results in much more quantization noise in the frequency band of interest. This increased quantization noise and increased number of transitions per second has not encouraged the use of DSM when a PWM technology has been available.

Thus, in order to overcome the problems associated with the harmonic noise generation and the need for triangle or sawtooth analog signal generation, a unique combination of PWM and DSM technologies has been created.

SUMMARY OF THE INVENTION

A control circuit which controls power delivered to a load with reduced spurious electromagnetic energy generation employs a delta sigma modulator which accepts a first signal and generates a second signal representing the first signal with a plurality of digital pulses. A pulse width modulator is coupled to the delta sigma modulator and accumulates the second signal over a first time period. The pulse width modulator generates a third signal for coupling to the load. The third signal has a first magnitude value, the first magnitude value lasting for a second time period.

DETAILED DESCRIPTION OF A PREFERRED EMBODIMENT

The invention disclosed herein is of a delta-sigma pulse-width modulator (DSPWM) which reduces the generation of harmonic noise and is suited for implementation in digital integrated circuit technologies.

Figures 1, 2:
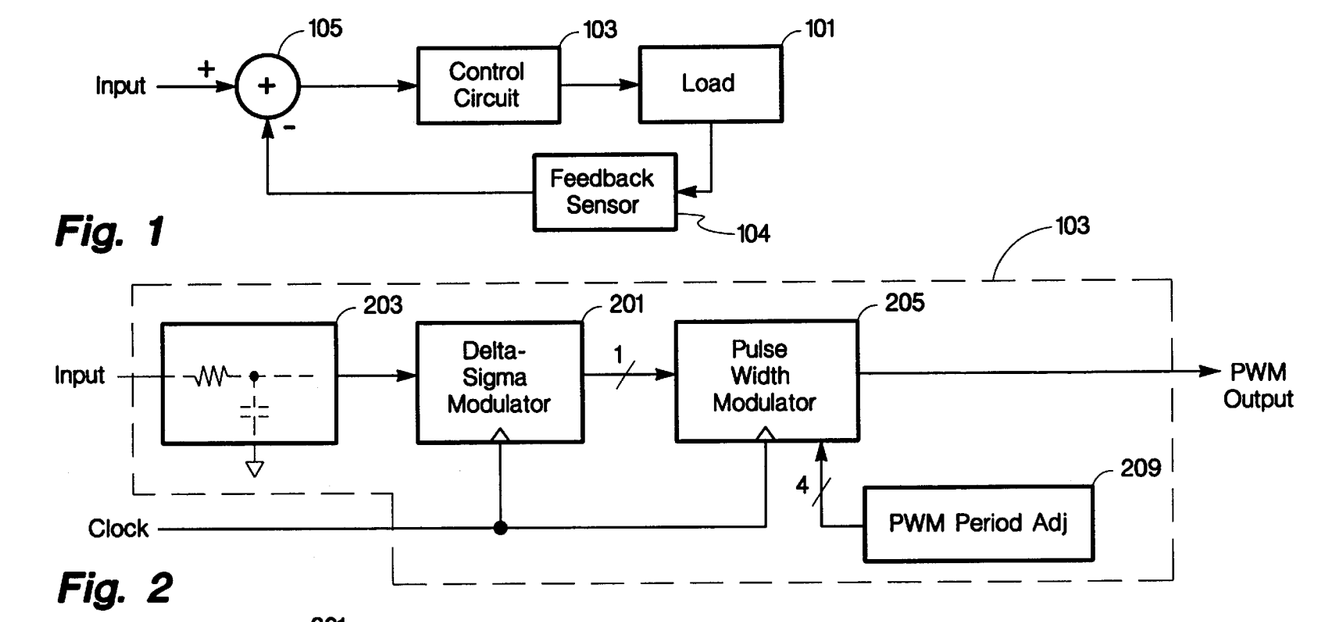
FIG. 1 is a simplified block diagram of a load control circuit.
FIG. 2 is a high level block diagram of a delta sigma pulse width modulator which may employ the present invention.

Referring first to FIG. 1, it can be seen that the simplest application of the present invention is in the control of power supplied to a load 101 by a control circuit 103. An operating parameter is sampled from the load 101 by feedback sensor 104 and fed back through the control circuit 103 for further control of the operating parameter. Such a feedback signal may be combined in the combination circuit 105 with an adjust signal which may modify the operating parameter of the load with an external adjustment. In a preferred embodiment, the load 101 is a conventional DC motor in which an operating parameter is to be controlled and adjusted by the control circuit 103. Such an arrangement can be considered to be a servomotor.

FIG. 2 illustrates a Delta Sigma Pulse Width Modulator (DSPWM) at the highest level of block diagram. A signal input to the control circuit 103 is coupled to a delta sigma modulator 201 by way of an optional input low pass filter 203 which, in the preferred embodiment, has a cut-off frequency of 50 KHz and a DSM clock frequency of 20 MHz. Signals near or above this cutoff frequency are not allowed to be coupled to the DSM 201 since they are likely to degrade the DSM operation. The DSM 201 is followed by a pulse width modulator 205 which accumulates the plurality of pulses constituting the DSM 201 output signal over a predefined period of time and converts it to a effective pulse width modulated output pulse for application to the load 101. In an integrated circuit implementation, the low pass filter 203 is located external to the integrated circuit chip. A clock signal is applied to both the delta sigma modulator 201 and the pulse width modulator 205 for proper synchronization of the circuit. In the preferred embodiment, the clock frequency is 20 MHz, which is much higher than the desired PWM frequency. A PWM period adjust circuit 209 is coupled to the pulse width modulator 205 by a 4 bit bus and selects the pulse PWM frequency by inputting a 4 bit binary code to the pulse width modulator. In the preferred embodiment, with a clock frequency of 20 MHz, the PWM frequency can be adjusted from 156.25 KHz to 9.7656 KHz. While not apparent in the block diagram of FIG. 2, the pulse width modulator 205 further provides pulse dithering and combination to reduce spurious harmonic noise generation.

Figure 3:
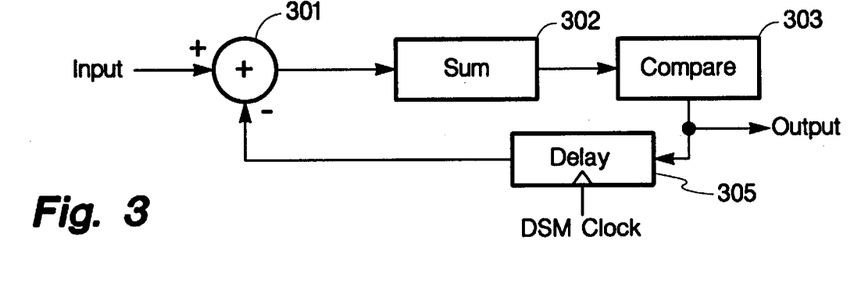
FIG. 3 is a generalized diagram of a delta sigma modulator which may be employed in the present invention.

The delta sigma modulator 201 utilizes the generalized block diagram of FIG. 3 in which the input signal is combined with the feedback signal in an adder 301, applied to a integrator which is then applied to a comparator 303, and fed back to the adder 301 by way of delay (register) 305 and output from the delta sigma modulator 201.

Figure 4:
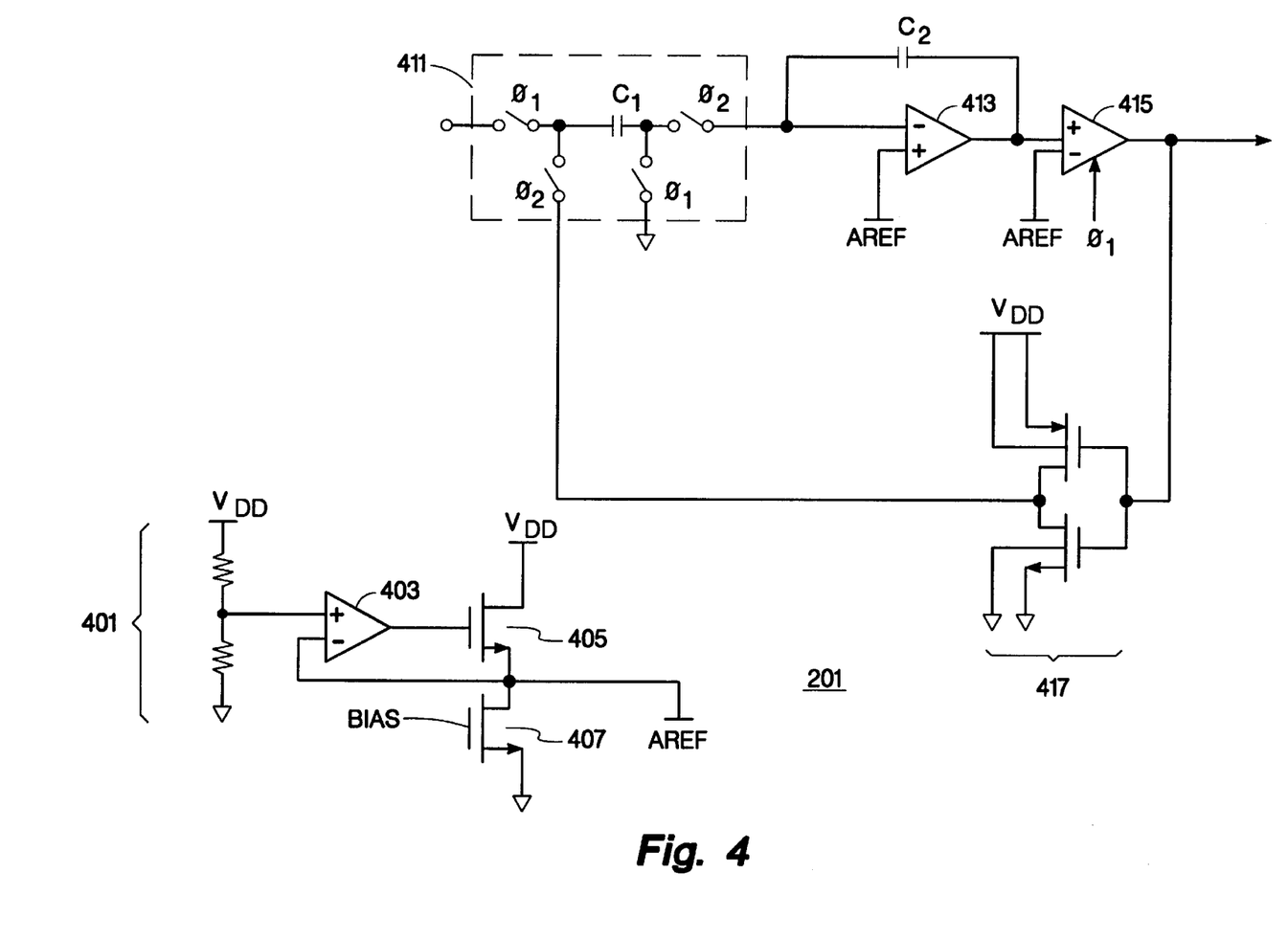
FIG. 4 is a schematic diagram of a delta sigma modulator which may be employed in the present invention.

A detailed schematic of the delta sigma modulator 201 employed in the preferred embodiment is shown in FIG. 4. An analog ground reference AREF is generated in conventional fashion from a voltage divider 401 connected between analog supply voltage, VDD, and ground such that the voltage between AREF and ground equals VDD/2 in the preferred embodiment. The output from the voltage divider 401 is coupled through an operational amplifier 403, connected in conventional fashion, to output drive transistors 405 and 407. A bias voltage is applied to the gate of transistor 407 such that, in the preferred embodiment, when the analog voltage VDD is equal to 3.3 volts, an analog ground reference, AREF, of 1.65 volts is developed.

The input signal is coupled to a conventional switched capacitor structure 411 consisting of a capacitor C1 and four solid state switches driven by two non-overlapping shifted clock signals at 20 MHz, $\phi_1$, and $\phi_2$ in the preferred embodiment. The output from the switched capacitor filter structure is connected to the inverting input of operational amplifier 413 along with integration capacitor C2 which is connected between the inverting input and output of operational amplifier 413. The output of the operational amplifier 413 is connected to the non-inverting input of latching comparator 415 and is referenced to MREF. The latched result of the comparison is the digital output. The digital output signal is also fedback to the input by way of a 1-bit digital/analog converter consisting of amplifier 417 and is connected to the $\phi_2$ leg of switched capacitor structure 411.

Figure 5:
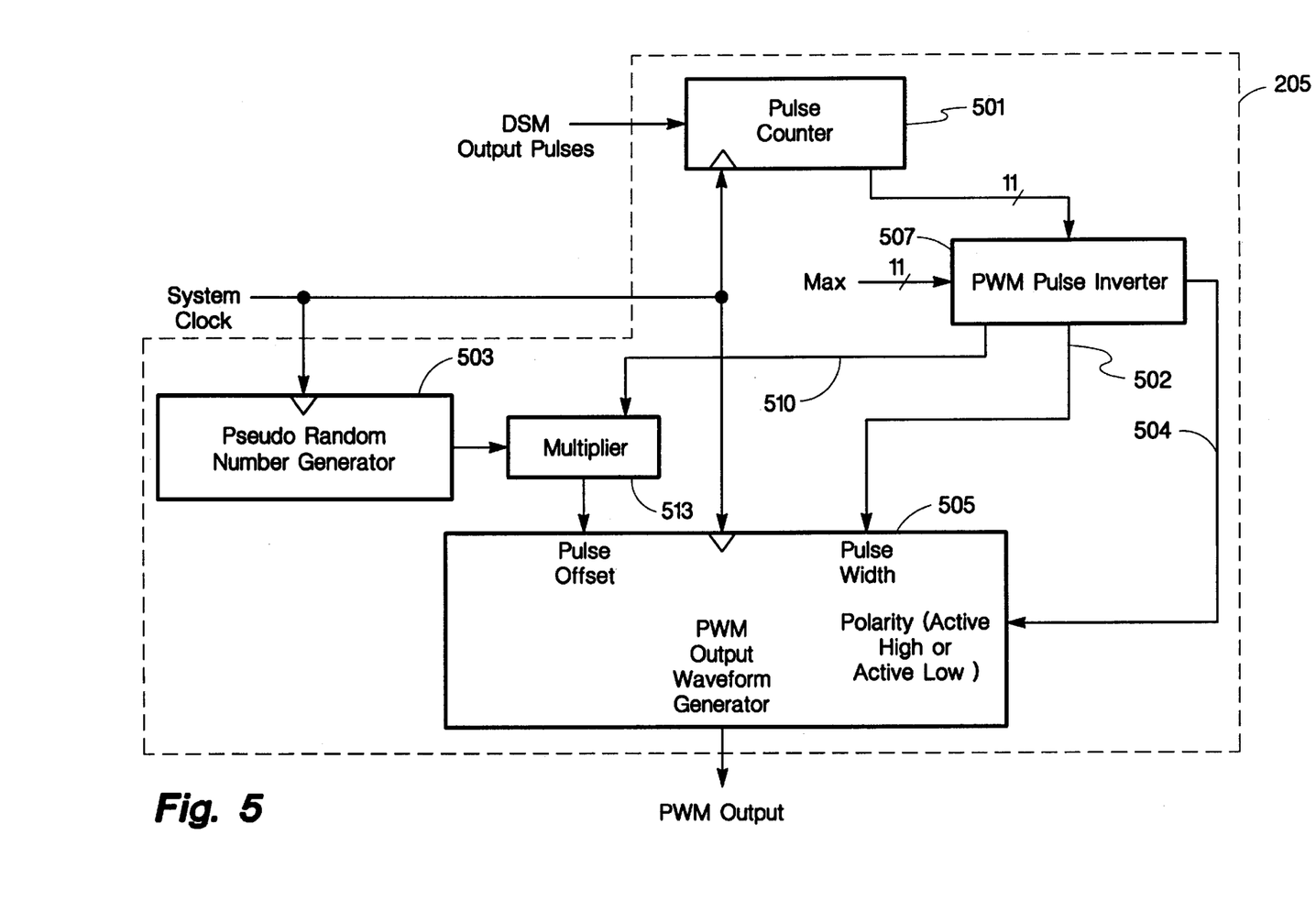
FIG. 5 is a block diagram of a pulse width modulator which may be employed in the present invention.

The output from the delta sigma modulator 201 is coupled to the pulse width modulator 205 to define the uncorrected pulse width of the PWM signal output to the load and an uncorrected maximum pulse offset signal. A simplified block diagram of the pulse width modulator 205 is shown in FIG. 5. In pulse counter 501, the pulse width modulator 205 accumulates the digital pulses output from the DSM circuit 201 over one PWM period. This accumulation of pulses determines the effective uncorrected duty cycle of the PWM waveform for the next period. Once the duty cycle of the next period is corrected by the PWM pulse inverter 507 and applied to line 502, the start of the associated PWM pulse is delayed for a pseudo-randomly determined number of system clock cycles which is determined by the random number generator 503. The pseudo-random number is chosen such that the probability distribution of the offset is evenly distributed between zero and the PWM period minus the corrected pulse width. Normally the PWM output pulse is a high going pulse commencing at the start of the PWM (as illustrated by waveform 601 of FIG. 6) or delayed by a pseudorandom offset 605, generated as previously described. However, when the duty cycle is determined to be over 50% by the PWM pulse inverter 507 and a "1" is applied to line 504, and the PWM output from the output waveform generator 505 is transformed under control of the pulse inverter 507. This transformation treats the PWM output signal as an active low rather than an active high and allows the active low portion, pulse 609, of the waveform (which has the shortest duration of time) to be offset within the pulse period by a pseudorandom delay 611, thereby creating a wider distribution in time of the PWM pulse offset for that particular pulse than if the pulse were not transformed.

Figure 6:
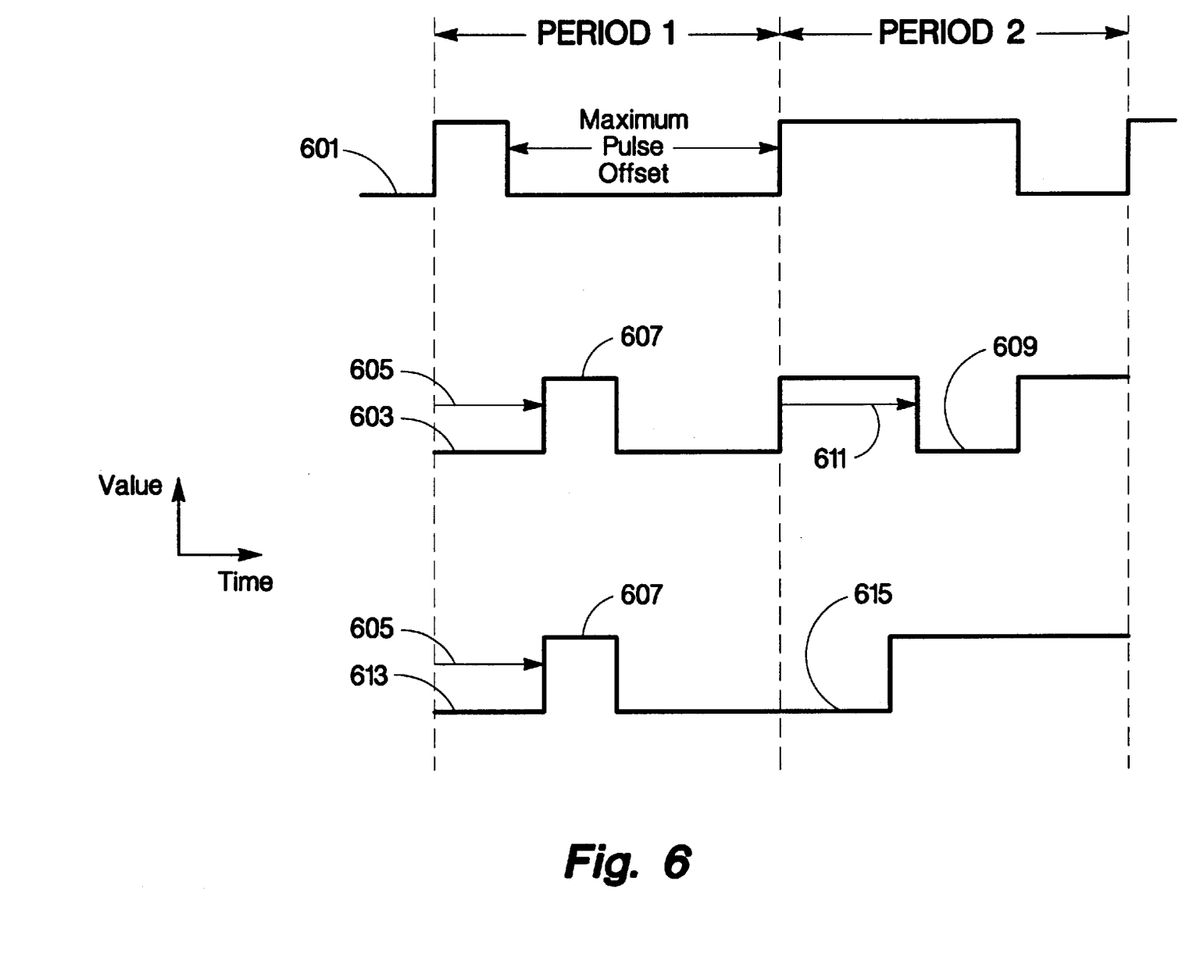
FIG. 6 is a timing diagram of pulse width modulated signals which may represent an output signal produced by a preferred embodiment of the present invention.

The pulse width modulator 205 also keeps constant the number of transitions made during consecutive PWM output signal periods. This is accomplished by delaying pulse transitions at the boundary of each PWM period, as illustrated by waveform 613, by zeroing the offset delay of the PWM output pulse during a PWM period for which the transformation from an active high pulse protocol to an active low pulse protocol (or vice versa) occurs from the previous period. If consecutive PWM periods utilize identical pulse protocols (active high to active high or active low to active low), this zeroing is not activated. This alleviates extraneous transitions such as the one on waveform 609 at the boundary between period 1 and period 2.

While not perceivable from FIG. 5, it can be seen that a register 713 and an exclusive—OR 709 (shown in FIGS. 7A and 7B) detect a transition from active high pulses to active low pulses or a transition from active low pulses to active high pulses from one PWM period to the next. This detection deactivates the register 723 via OR gate 741, thereby creating an effective zero as an output from the pseudorandom number generator 503, thereby forcing a pulse offset of zero. Signal 510 output from the pulse inverter 507 represents the maximum corrected pulse offset available for the PWM output pulse and is applied to the multiplier 513. Multiplier 513 effectively scales the corrected maximum pulse offset signal 510 by the pseudorandom number generated by pseudorandom number generator 503. This process results in the final randomized (dithered) PWM pulse offset.

A timing diagram illustrating three possible variations in a PWM output signal is shown in FIG. 6. Two PWM periods, period one and period two, are shown on the time axis of FIG. 6. Waveform 601 is a conventional PWM output signal in which the output duty cycle is 20% for the first pulse period and in which the PWM output signal has a duty cycle of 70% during the second PWM pulse period. Observe that PWM output signal 601 is shown having a transition at the boundary of each PWM period. One feature of the present invention is illustrated in the PWM output waveform 603 in which a random offset 605 has been introduced in the commencement of active high pulse 607 away from the boundary of the commencement of PWM period 1 by the pseudorandom number generator 503 and the PWM output waveform generator 505. The pulse 607 is displaced away from the PWM period 1 commencement boundary by a time equal to a pseudorandom number of 50 nanosecond (20 MHz) system clock pulses in the preferred embodiment. Likewise, the active low pulse 609 during PWM period 2 is treated as a discrete pulse and is randomly shifted away from the PWM period 2 pulse boundary by a pseudorandom offset 611. Random offset 611 is created when the pulse counter 501 indicates a (positive) pulse width greater than 50% to the PWM output generator 505. The output from the pulse counter 501 is inverted (corrected) by PWM pulse inverter 507 to be input as a pulse width defining parameter to the PWM output waveform generator 505. The waveform 613 of FIG. 6 illustrates another feature of the present invention. Positive pulse 607 continues to be offset from the period 1 PWM boundary by random offset 605. In order to keep constant the number of transitions within each period, active low pulse 609 is not placed randomly within the PWM period 2 but is moved to the pulse boundary at which the value of pulse 609 is equal to the preceding PWM output signal value and is shown in FIG. 6 as negative pulse 615. Thus, when the PWM output signal during a present PWM period uses an active high pulse protocol following an immediately prior PWM period with a PWM output signal employing an active high protocol, the pulse in the present period is randomly offset from the PWM period boundary by a pseudorandom offset. But when the PWM output signal of the present PWM period uses an active low protocol immediately following a PWM period employing an active high protocol, the active low pulse is aligned at the PWM boundary with the same signal value, thereby reducing the number of transitions for the system. This zeroing of the offset occurs whenever the pulse protocol transitions. This is accomplished in the preferred embodiment by zeroing out the value output from pseudorandom number generator 503. Specifically, and referring to FIGS. 7A and 7B, the output of the pseudorandom number generator 503 is zeroed by the offset disable function. Exclusive—OR 709 and register 713 develop a signal which essentially zeros out the output of pseudorandom number generator 503 for the particular PWM period in process. OR gate 741 couples a clearing signal as though the dithering operation were disabled for that one PWM period by forcing a phase offset for that pulse. The pulses are always inverted (i.e. the pulse protocol is active low) when the duty cycle is greater than 50%, but the offset is set to zero only when there is an active high/active low pulse change or an active low/active high change.

Figure 7A:
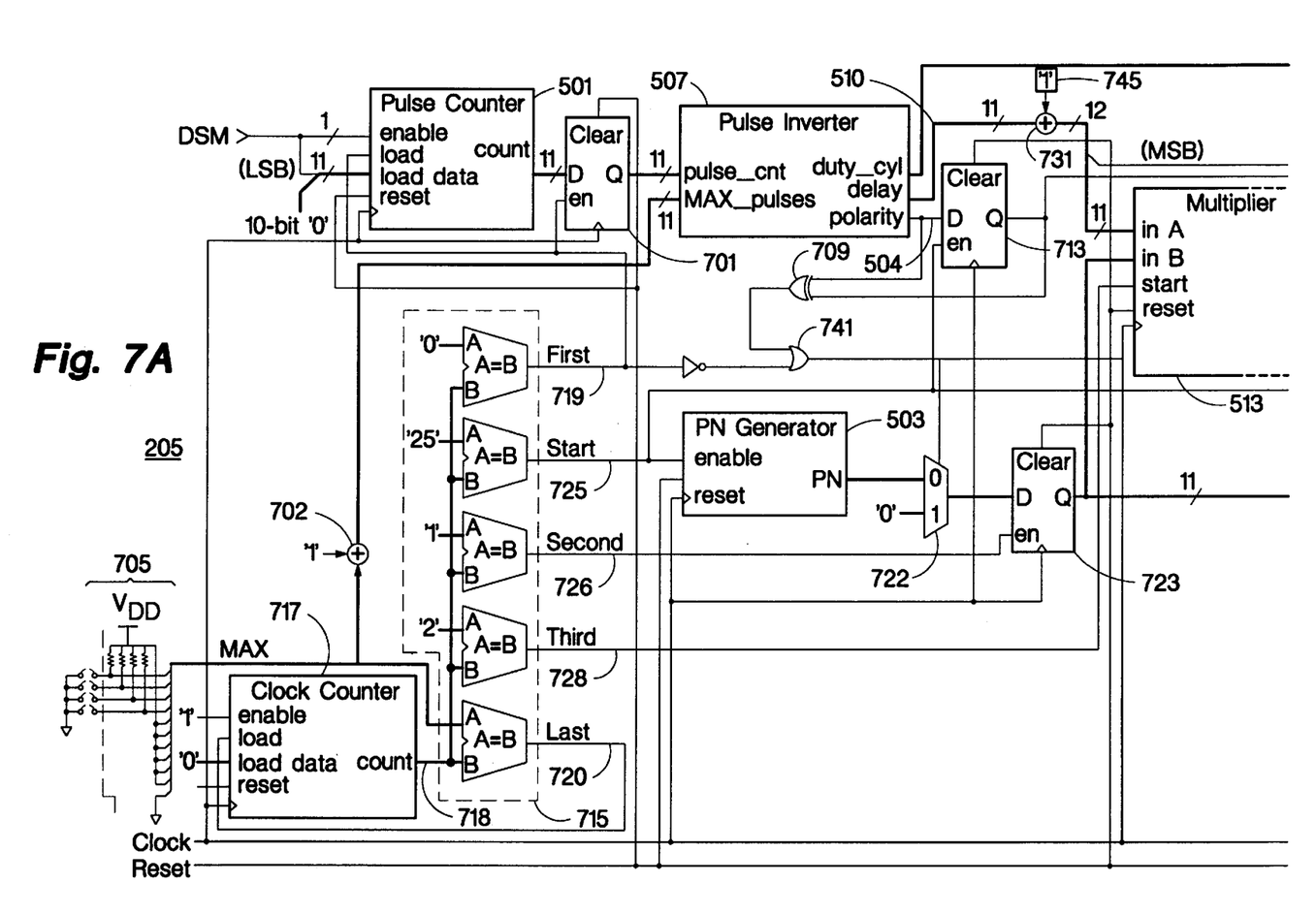
FIGS. 7A and 7B, taken together, are a detailed block diagram of a pulse width modulator circuit which may be employed in the present invention.
Figure 7B:
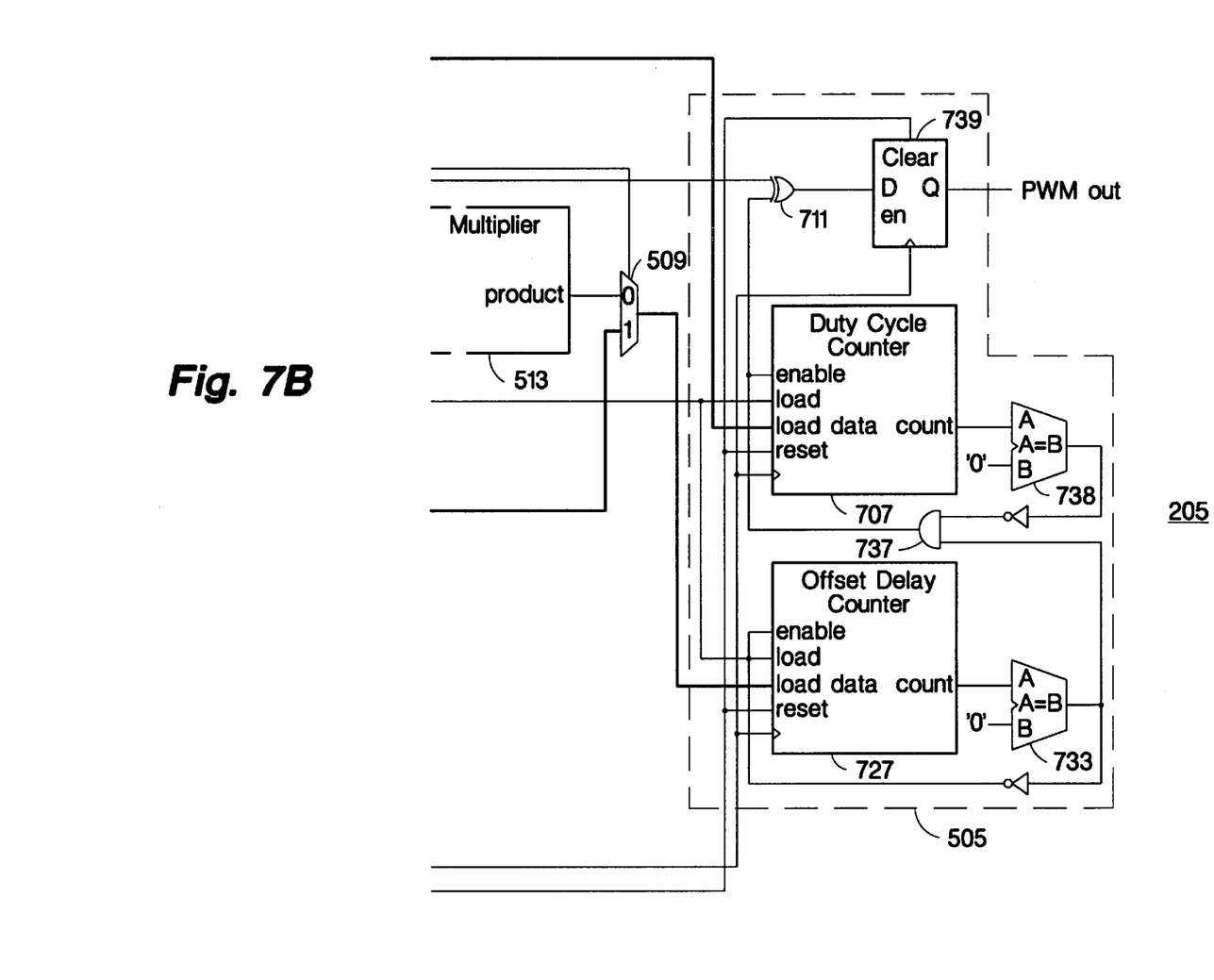

FIGS. 7A and 7B illustrate a detailed block diagram of the pulse width modulator 205. The pulses output from the delta sigma modulator 201 are input to a pulse counter 501 which accumulates the pulses into an 11 bit word to be output to an 11 bit bus which, upon the occurrence of the end of the current PWM period, is coupled through a register 701 to the asynchronous pulse inverter 507. The pulse inverter 507 also accepts an 11 bit wide MAX bus input in which the four most significant bits are predeterminedly selected by jumpers (as indicated by jumper field 705) or by switches or by other means and which utilizes an adder 702 to increment the MAX bus by one to provide a non zero (actual count) input to the pulse inverter. The pulse inverter 507 employs the two 11 bit buses to determine the duty cycle and maximum pulse offset of the next PWM pulse and presents the duty cycle to the duty cycle counter 707. The pulse inverter 507 also presents the maximum pulse offset to the multiplier 513 for pseudorandom scaling, which scaled pulse offset is, in turn, presented to the delay counter 727 (by way of multiplexer 509) and loaded (at the appropriate time) to output a binary duty cycle signal on line 735 which in turn enables the duty cycle counter 707. In order to perform the function of a pulse protocol inverter, the pulse inverter 507 also outputs a pulse polarity (or pulse protocol) signal on line 504 to exclusive—OR 709 (which functions as an active high/active low pulse protocol change detector in conjunction with register 713) and to exclusive—OR 711 by way of register 713. When the clock counter 717 count at line 718 is equal to the 11 bit MAX bus, the PWM period is deemed ended, the control logic 715 outputs a pulse indicating the end of the PWM period on line 720, and a new PWM pulse period immediately follows. In short, the duty cycle counter 707 keeps track of the PWM duty cycle and clock counter 717 keeps track of the PWM period.

The control logic function 715 is implemented in a distributed logic fashion in the preferred embodiment and is physically arranged in different areas of the integrated circuit. The basic function of the control logic 715 is to generate control signals for the pulse width modulation circuit from the clock counter count on line 718, the PWM period established by the MAX bus, and internally monitored clock counts starting at "0" and continuing through a total clock count equal to the number set on the MAX bus. As illustrated for the preferred embodiment, the number of clock counts are input to a plurality of comparators to generate control signals for the remainder of the pulse width modulation circuit. At the first clock count (clock count "0") the control logic 715 creates a binary "first" pulse applied to line 719 to distinguish the first system clock cycle of the current PWM period. The first pulse is coupled to the "clear" input of pulse counter 501, the "enable" input of register 701, and to multiplexer 722 for removal of offset at pulse protocol change. The control logic 715 also creates a binary "start" signal applied to line 725. The start signal, in the preferred embodiment, occurs at the twenty-fifth clock count and indicates that the multiplier output will be latched at the next clock pulse. The start signal is coupled to the pseudorandom number generator 503 which, in the preferred embodiment, is a conventional linear feedback shift register (LFSR) pseudorandom number generator, to trigger the generation of a new pseudo random number. The start signal is also coupled, as a "load" signal to the duty cycle counter 707 and a delay counter 727. A "second" pulse generated at the count of the second clock count is coupled via line 726 to the enable port of register 723 to allow passage of a generated pseudorandom number. A "third" pulse is coupled to the multiplier 513 on line 728 to turn the multiplier on.

The delay counter 727 generally keeps track of the needed offset delay for the PWM pulse. In addition to the start signal, the delay counter 727 inputs the calculated PWM offset for the new PWM pulse from multiplexer 509 (FIG. 7B). The random number generator 503 outputs an 11 bit word (which is coupled by register 723 which is enabled by the first pulse and cleared by the output from exclusive—OR gate 709 when the pulse protocol changes) for coupling to the multiplier 513 and the multiplexer 509. The multiplier 513 also accepts an 11 bit signal from the pulse inverter 507 representing the maximum possible offset to which a value of "1" from ones value generator 745 is added in adder 731 before being applied to the multiplier 513. It is a feature of the present invention that the addition of "1" assures the eventual (truncated) output of the multiplier to be a good rounded representation of the pseudorandom number multiplied by the maximum possible offset. A carry output is coupled to the multiplexer 509 to switch the multiplexer 509 when the maximum possible offset is the full width of the PWM period (all "1"s). In this case a multiply is unnecessary and the pseudorandom number is used as the output of the multiplier 521.

The delay counter 727 outputs an 11 bit bus to a count detector 733 which provides a binary output on line 735 when the count output from the delay counter equals "0". This output is coupled to the noninverting input of a AND gate 737.

The output from the duty cycle down counter 707 is output as an 11 bit bus to count detector 738 which detects an output from duty cycle down counter 707 equal to 0. Upon this occurrence, a binary signal is applied to the inverting input of AND gate 737 which is in turn coupled to exclusive—OR gate 711 for coupling as a PWM signal via register 739. A non-zero value in the down counter 707 causes a "1" to be output from the AND gate 737 (acting as a comparator). This signal is "enabled" by the output of detector 733 resulting in a non-polarized PWM pulse. The pulse is then polarized by the exclusive—OR gate 711 and the polarity (protocol) signal from 713 to create the final PWM pulse illustrated as PWM output waveform 603 in FIG. 6. Extra transitions are removed by exclusive—OR gate 709 when the active high/active low protocol flips from one PWM period to another by disabling the PWM offset and setting it to zero for that one particular PWM pulse, as illustrated as PWM output waveform 613. Duty cycle counter 707 and delay counter 727 are implemented, in the preferred embodiment, as conventional 11 bit down counters.

Figure 8:
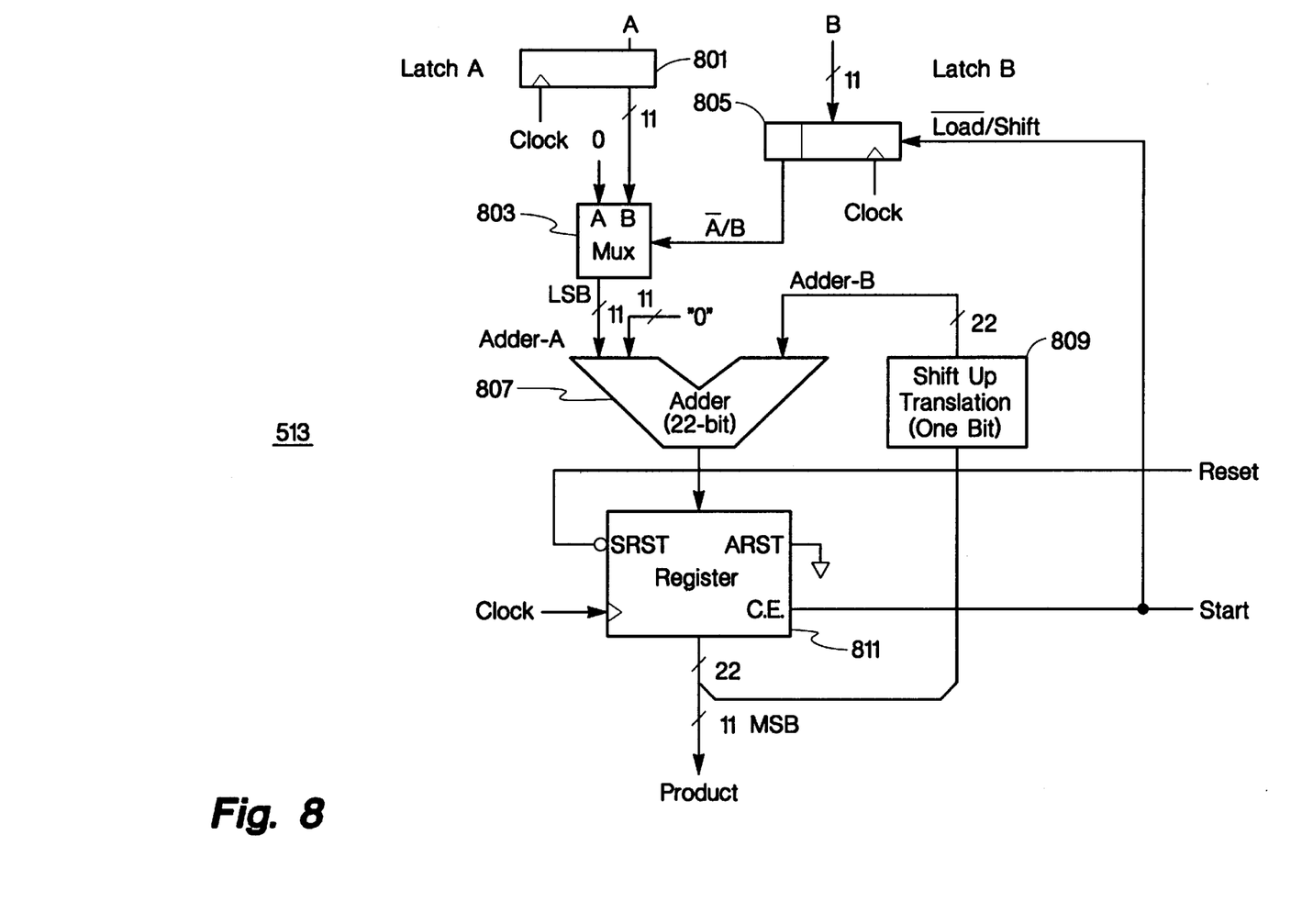
FIG. 8 is a detailed block diagram of a multiplier which may be employed in the pulse width modulator of FIGS. 7A and 7B.

Multiplier 513 is shown in further detail in FIG. 8. This multiplier is a typical "shift and add" multiplier, in which the input from the pulse inverter is considered to be an integer and the input from the pseudorandom generator is considered to be a fraction in the range of (0,1). The use of 11 of the 22 bits is a rounding function. Input A from the pseudorandom number generator 503 is first input to a latch 801 and coupled as an 11 bit wide number to multiplexer 803. The output of multiplexer 803, an 11 bit wide number, is determined output latch 805 which receives an 11 bit wide number from the pulse counter 507 as an input. The output from multiplexer 803 is input to 22 bit adder 807 where it is added to 22 bit wide number from the shift up translation 809. The 22 bit output from adder 807 is applied to register 811 and output to multiplexer 509 as an 11 bit number (the most significant bits of the 22 bit bus).

Figure 9:
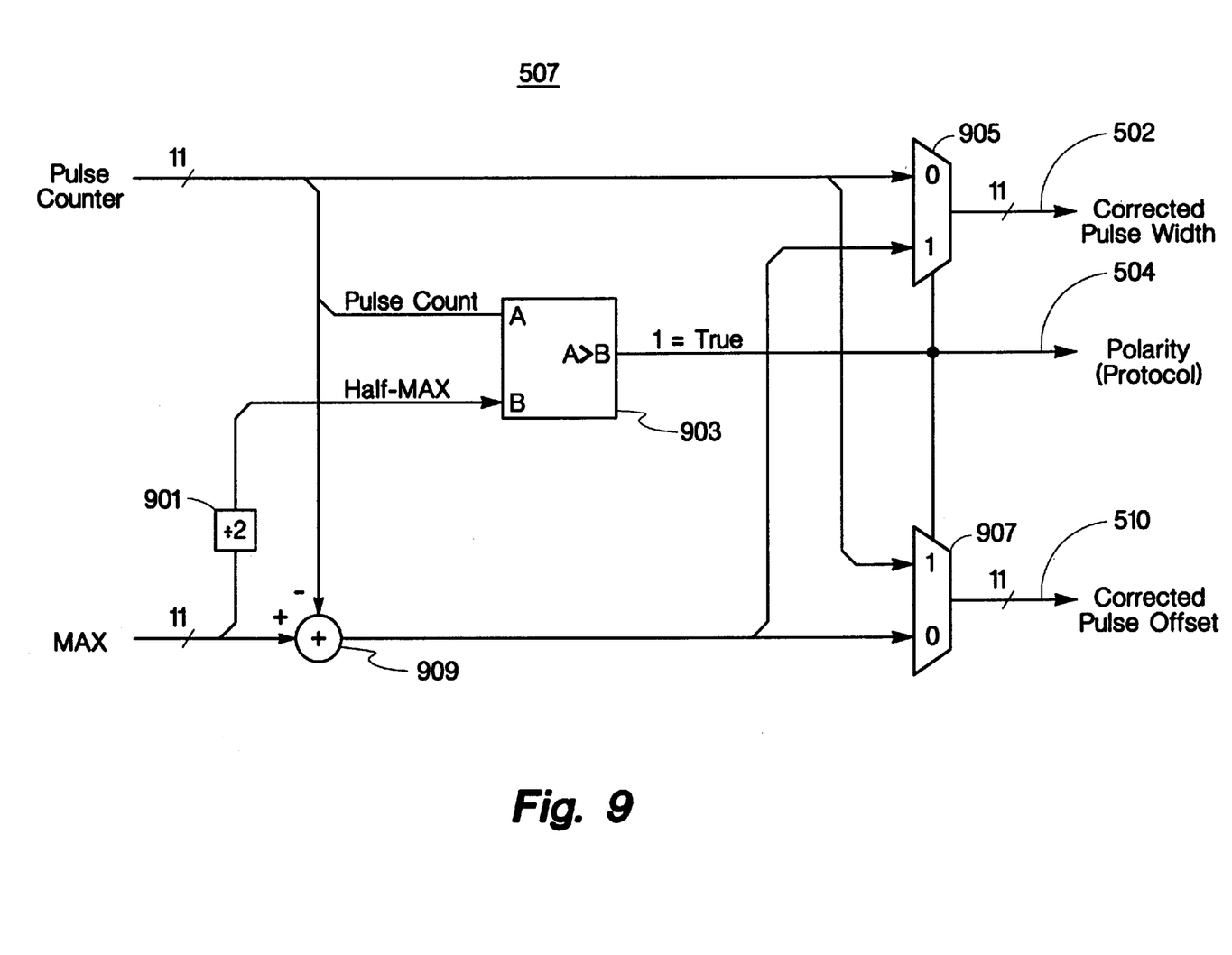
FIG. 9 is a detailed block diagram of a pulse inverter which may be employed in the pulse width modulator of FIGS. 7A and 7B.

A detailed diagram of the pulse inverter 507 is shown in FIG. 9. The input of the MAX signal is divided by two by shifting in divider 901 and applied to conventional 11 bit comparator 903 where it is compared to the 11 bit number from the pulse counter 501 to determine whether the current PWM output signal has a duty cycle of greater than 50%. Thus, when the 11 bit number from the pulse counter exceeds one-half the MAX signal, the comparator outputs a binary pulse indicating a reversal of active high to active low protocol will be needed. The pulse counter output signal is also applied to multiplexer 905 and multiplexer 907 which select between the pulse counter signal and the difference between the MAX signal and the pulse counter signal as generated by the 11 bit adder 909. Multiplexer 905 thus selects between the pulse counter 11 bit number and the difference between the MAX signal and the pulse counter number. The output values from the pulse inverter are considered corrected values.

Thus a delta sigma modulator when coupled with a pulse width modulator provides a reduction in harmonic noise generation without the requirements for triangle or sawtooth analog signal generation. Reduction in the peak energy of the harmonic frequency generation has been shown to be about 10 dB compared to that of conventional pulse width modulation techniques.

I claim:

1. A control circuit for controlling power delivered to a load with reduced spurious electromagnetic energy generation, comprising:
    a delta sigma modulator accepting a first signal and generating a second signal representing said first signal with a plurality of digital pulses; and
    a pulse width modulator coupled to said delta sigma modulator, accumulating said second signal over a first time period, and generating a third signal coupled to the load and having a first magnitude value, said first magnitude value lasting for a second time period related to said second signal.

2. A control circuit in accordance with claim 1 wherein said pulse width modulator comprises:
    a pulse counter to accumulate said plurality of digital pulses of said generated second signal; and
    a waveform generator, coupled to said pulse counter, to generate said third signal from a predetermined number of said accumulated plurality of digital pulses of said generated second signal, said third signal including a third time period greater than and encompassing said second time period.

3. A control circuit in accordance with claim 2 wherein said first time period is equal to said third time period.

4. A control circuit in accordance with claim 2 further comprising a delay generator coupled to said waveform generator and generating a time delay signal to delay a commencement of said second time period from a commencement of said third time period by a time equal to that of said time delay signal.

5. A control circuit in accordance with claim 2 wherein said pulse width modulator further comprises a pulse width indicator to indicate when an accumulation of said plurality of digital pulses of said generated second signal creates a third signal second time period lasting for greater than 50% of said third time period.

6. A control circuit in accordance with claim 5 wherein said pulse width indicator comprises:
    a divide-by-two coupled to a fourth signal representing said third time period to generate a halved fourth signal; and
    a comparator coupled to said divide-by-two to accept said halved fourth signal, coupled to said pulse counter to accept said accumulated plurality of digital pulses of said generated second signal, and outputting a two state signal representing with a first state that said accumulated plurality of digital pulses of said generated second signal is greater than said halved fourth signal, thereby indicating that said second time period exceeds 50% of said third time period, and representing with a second state that said accumulated plurality of digital pulses of said generated second signal is less than said halved fourth signal, thereby indicating that said second time period does not exceed 50% of said third time period.

7. A control circuit in accordance with claim 5 wherein said pulse width modulator further comprises a pulse protocol inverter coupled to said pulse width indicator to transform said third signal from an active high first magnitude value protocol to an active low first magnitude value protocol.

8. A control circuit in accordance with claim 7 wherein said pulse protocol inverter comprises:
an adder, coupled to said pulse counter, for subtracting said accumulated plurality of digital pulses of said generated second signal from a fourth signal representing said third time period thereby generating a difference signal; and
a multiplier coupled to said pulse counter for receiving said accumulated plurality of digital pulses of said generated second signal, coupled to said adder for receiving said difference signal, and coupled to said pulse width indicator to receive an indication when said second time period exceeds 50% of said third time period and switching a multiplexer of said pulse width modulator from said accumulated plurality of digital pulses of said generated second signal to said difference signal upon said exceeding of 50%.

9. A control circuit in accordance with claim 7 further comprising:
a delay generator coupled to said waveform generator and generating a time delay signal to delay a commencement of said second time period from a commencement of said third time period by a time equal to that of said time delay signal; and
a delay generator disable coupled to said delay generator and said pulse protocol inverter for forcing said time delay signal to be zero time when said first time period has said active high first magnitude value protocol and is immediately followed by a following first period having said active low first magnitude value protocol, thereby reducing the number of transitions from said first magnitude value to a second magnitude value during said following first period.

10. A control circuit in accordance with claim 7 wherein said pulse width modulator further comprises:
an adder accepting a bus output from said pulse protocol inverter; and
a ones value generator coupled to said adder to increase a digital signal present on said bus output by a value of one for rounding of said digital signal.

11. A control circuit in accordance with claim 7 further comprising:
a delay generator coupled to said waveform generator and generating a time delay signal to delay a commencement of said second time period from a commencement of said third time period by a time equal to that of said time delay signal; and
a delay generator disable coupled to said delay generator and said pulse protocol inverter for forcing said time delay signal to be zero time when said first time period has said active high first magnitude value protocol and is immediately followed by a following first period having said active low first magnitude value protocol and when said first time period has said active low first magnitude value and is immediately followed by a following first period having said active high first magnitude value protocol, thereby reducing the number of transitions from said first magnitude value to a second magnitude value during said following first period.

12. A method of controlling power delivered to a load with reduced spurious electromagnetic energy generation, comprising the steps of:

accepting a first signal input to a delta sigma modulator;
generating a second signal representing said first signal with a plurality of digital pulses;
accumulating said second signal over a first time period; and
generating a third signal coupled to the load and having a first magnitude value, said first magnitude value lasting for a second time period related to said second signal.

13. A method in accordance with the method of claim 12 further comprising the steps of:
accumulating said plurality of digital pulses of said generated second signal;
setting a third time period equal to said first time period; and
generating said third signal, from a predetermined number of said accululated plurality of digital pulses of said generated second signal, said third signal including said third time period which is greater than and which encompasses said second time period.

14. A method in accordance with the method of claim 13 further comprising the step of generating a time delay signal to delay a commencement of said second time period from a commencement of said third time period by a time equal to that of said time delay signal.

15. A method in accordance with the method of claim 13 further comprising the step of indicating when an accumulation of said plurality of digital pulses of said generated second signal creates said third signal second time period lasting for greater than 50% of said third time period.

16. A method in accordance with the method of claim 13 further comprising the steps of:
dividing by a factor of two a fourth signal representing said third time period to generate a halved fourth signal;
accepting said halved fourth signal and said accumulated plurality of digital pulses of said generated second signal; and
outputting a two state signal representing with a first state that said accumulated plurality of digital pulses of said generated second signal is greater than said halved fourth signal, thereby indicating that said second time period exceeds 50% of said third time period, and representing with a second state that said accumulated plurality of digital pulses of said generated second signal is less than said halved fourth signal, thereby indicating that said second time period does not exceed 50% of said third time period.

17. A method in accordance with the method of claim 13 further comprising the step of transforming said third signal with a pulse protocol inverter from an active high first magnitude value protocol to an active low first magnitude value protocol.

18. A method in accordance with the method of claim 17 further comprising the steps of:
subtracting said accumulated plurality of digital pulses of said generated second signal from a fourth signal representing said third time period thereby generating a difference signal;
outputting said accumulated plurality of digital pulses of said generated second signal;
receiving an indication when said second time period exceeds 50% of said third time period; and
outputting said difference signal rather than said accumulated plurality of digital pulses of said generated second signal upon said exceeding of 50%.

19. A method in accordance with the method of claim 17 further comprising the steps of:

generating a time delay signal to delay a commencement of said second time period from a commencement of said third time period by a time equal to that of said time delay signal; and forcing said time delay signal to be zero time when said first time period has said active high first magnitude value protocol and is immediately followed by a following first period having said active low first magnitude value protocol, thereby reducing the number of transitions from said first magnitude value to a second magnitude value during said following first period.

20. A method in accordance with the method of claim 17 further comprising the steps of:

accepting a bus output from said pulse protocol inverter; and adding a value of one to said bus output to increase a digital signal present on said bus output for rounding of said digital signal.

21. A method in accordance with the method of claim 17 further comprising the steps of:

generating a time delay signal to delay a commencement of said second time period from a commencement of said third time period by a time equal to that of said time delay signal, and forcing said time delay signal to be zero time when said first time period has said active high first magnitude value protocol and is immediately followed by a following first period having said active low first magnitude value protocol and when said first time period has said active low first magnitude value protocol and is immediately followed by a following first period having said active high first magnitude value protocol, thereby reducing the number of transitions from said first magnitude value to a second magnitude value during the following first period.

* * * * *